(12) United States Patent
Chen et al.

(10) Patent No.: US 7,324,402 B1
(45) Date of Patent: Jan. 29, 2008

(54) FLASH MEMORY STRUCTURE (75) Inventors: Hsin-Chien Chen, Hsinchu (TW); Shin-Jang Shen, Hsinchu (TW); Fu-Chia Shone, HsinChu (TW)

(73) Assignee: Skymedi Corporation, Hsinchu (TW)

( * ) Notice: Subject to any disclaimer, the term of this patent is extended or adjusted under 35 U.S.C. 154(b) by 16 days.

(21) Appl. No.: 11/462,985

(22) Filed: Aug. 7, 2006

(51) Int. Cl.
*G11C 8/00* (2006.01)

(52) U.S. Cl. .............................. 365/230.03; 365/185.13
(58) Field of Classification Search ................... 365/63, 365/185.05, 185.11, 185.12, 185.13, 185.16, 365/185.17
See application file for complete search history.

(56) References Cited

U.S. PATENT DOCUMENTS 5,717,636 A * 2/1998 Dallabora et al. ...... 365/185.13
7,233,514 B2 * 6/2007 Curatolo et al. ............ 365/100

* cited by examiner

*Primary Examiner*—Derrick W. Ferris
*Assistant Examiner*—Harry W Byrne
(74) *Attorney, Agent, or Firm*—Winston Hsu (57) ABSTRACT

A flash memory includes: a plurality of switches; a global bit line; and a plurality of memory blocks, each containing a plurality of local bit lines, and a plurality of memory units coupled to the plurality of local bit lines respectively. A first switch couples a first local bit line to the global bit line; a second switch couples a second local bit line to the global bit line; a third switch couples the first local bit line to a first voltage source; and a fourth switch couples the second local bit line to a second voltage source.

7 Claims, 8 Drawing Sheets

FLASH MEMORY STRUCTURE

BACKGROUND OF THE INVENTION

1. Field of the Invention

The present invention relates to a flash memory structure, and more particularly, to a novel flash memory structure having fewer global bit lines and smaller layout size.

2. Description of the Prior Art

Figure 1:
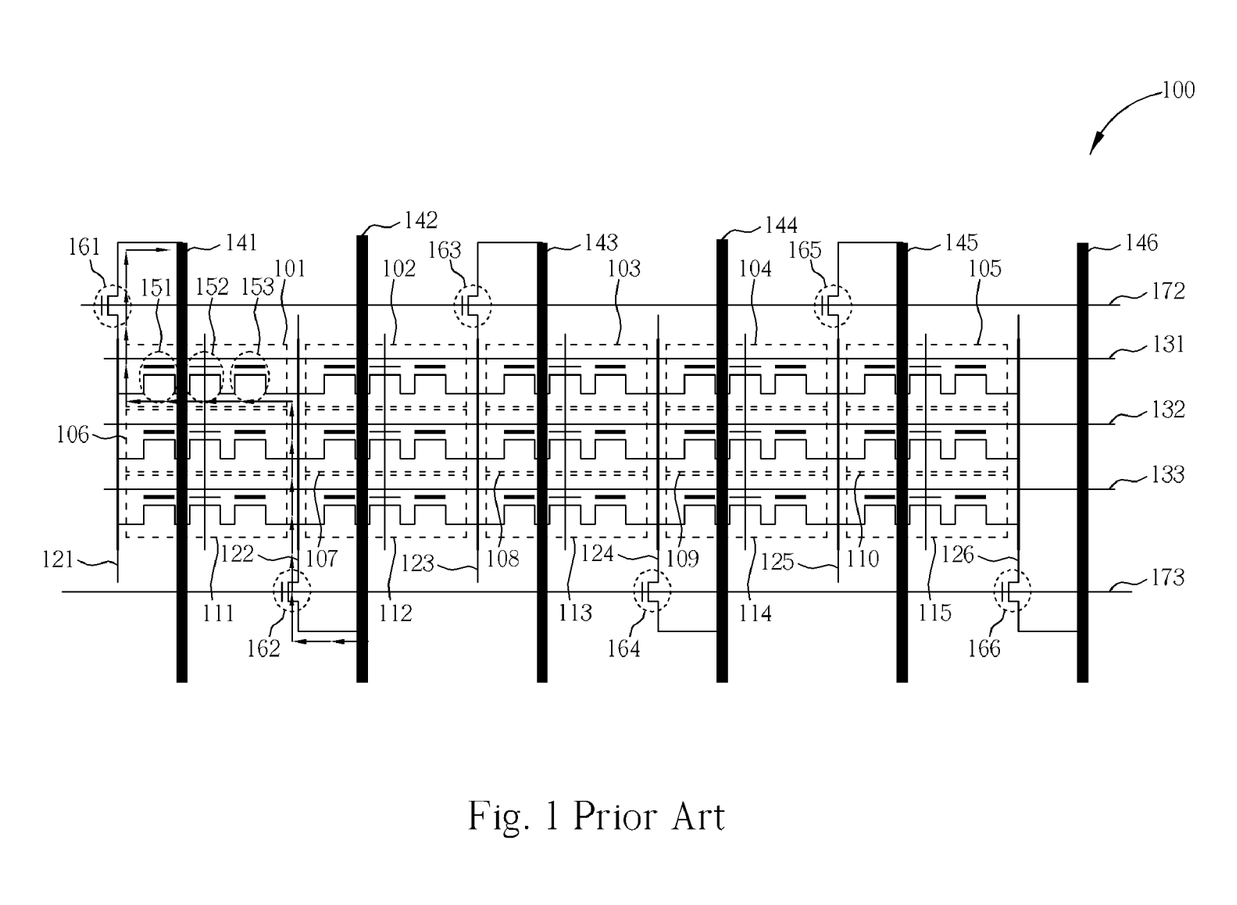
FIG. 1 is a diagram of a section of a conventional flash memory device.

Please refer to FIG. 1, which is a diagram of a block of a conventional flash memory device 100. The flash memory device 100 comprises a plurality of local bit lines 121-126, a plurality of word lines 131-133, a plurality of global bit lines 141-146, and a plurality of memory units 101-115 arranged in an array. As is well known in the art, each memory unit 101-115 comprises a memory cell 151, a select switch 152, and a memory cell 153.

In addition, each local bit line 121-126 is respectively coupled to each global bit line 141-146 through a plurality of switches 161-166. Each memory unit 101-115 is operated according to the supplying voltage of the word lines 131-133 and the global bit lines 141-146. Furthermore, the switches 161-166 are implemented by MOSFETs. And the gates of switches 161, 163, and 165 are coupled to the conducting line 172, and the gates of switches 162, 164, and 166 are coupled to the conducting line 173.

When memory cell 151 of memory unit 101 is accessed, the switches 161 and 162 are both turned on by conducting lines 172 and 173, and a voltage 0V is applied to the global bit line 141, and another voltage 1.2V is applied to the global bit line 142. Therefore, the local bit line 121 is coupled to 0V through the switch 161, and the local bit line 122 is coupled to 1.2V through the switch 162. In addition, the word line 131 is supplied by a high voltage such that the memory unit 101 can be selected. Therefore, the signal path (shown as the arrow in FIG. 1) can be established.

The aforementioned flash memory structure 100 has a serious problem, however. Please refer to FIG. 1 again. One global bit line occupies the space of one memory unit column. Because semiconductor manufacturing techniques are constantly improving, the memory unit 101-115 can be formed much smaller than before. But the width of the global bit line 141-146 cannot be narrowed easily. Therefore, the size of the memory array is limited by the pitch of the global bit lines 141-146.

In order to solve the above-mentioned problem, another memory structure is disclosed. Please refer to FIG. 2, the flash memory device 200 comprises a plurality of local bit lines 221-226, a plurality of word lines 231-233, a plurality of global bit lines 241-243, and a plurality of memory units 201-215 arranged in an array. As mentioned previously, each memory unit 201-215 comprises a memory cell 251, a select switch 252, and a memory cell 253.

Figure 2:
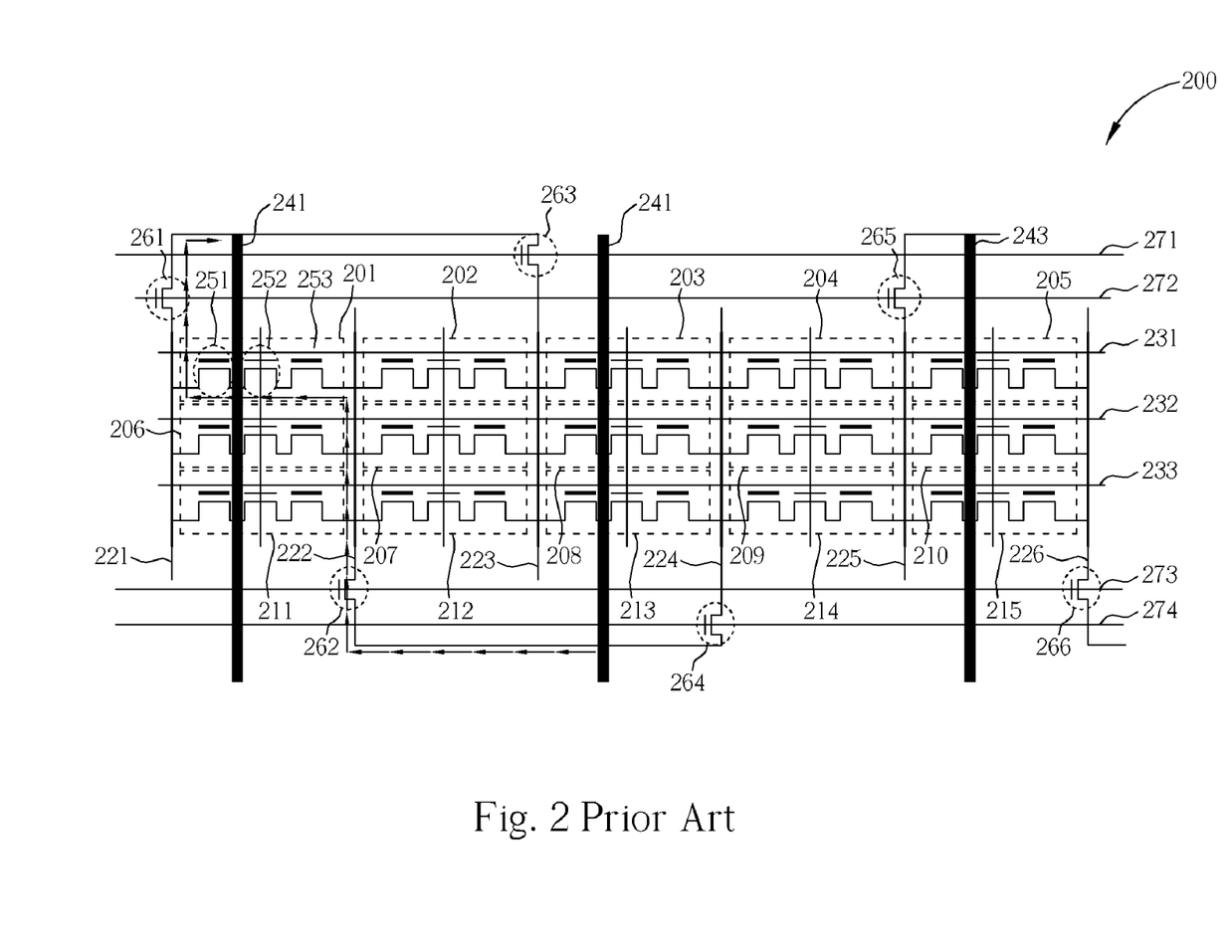
FIG. 2 is a diagram of a section of another conventional memory block.

In FIG. 2, the local bit lines 221 and 223 are coupled to the global bit line 241 through switches 261 and 263. Similarly, the local bit lines 222 and 224 are respectively coupled to the global bit line 242 through switches 262 and 264.

To access the memory cell 251 of the memory unit 201, the global bit line 241 is applied by 0V and global bit line 242 is applied by 1.2V. Therefore, the local bit line 221 is coupled to 0V through switch 261 and the local bit line 262 is coupled to 1.2V through switch 262. The word line 231 is supplied by a high voltage such that the memory unit 251 can be selected. The signal path shown in the arrow in FIG. 2 can be established.

Although the problem of global bit lines pitch is solved, another problem occurs. Any operation on the memory unit 201 needs two global bit lines 241 and 242. It is impossible to access memory unit 201 and 203 at the same time as in FIG. 1. The efficiency of the flash memory device 200 is reduced.

SUMMARY OF THE INVENTION

It is therefore one of the primary objectives of the claimed invention to provide a novel flash memory structure having fewer global bit lines and smaller layout size, to solve the above-mentioned problem.

According to the present invention, the flash memory comprises: a plurality of global bit lines comprising a first global bit line and a plurality of memory blocks. Each memory block comprises: a plurality of local bit lines comprising a first local bit line and a second local bit line; a plurality of memory units arranged in an array, each of the memory units comprising a first memory cell coupled to a first end, a second memory cell coupled to a second end, and a select switch coupled to a select line, the first memory cell, and the second memory cell; wherein the memory units comprise a plurality of first memory units, the first end of each of the first memory units being coupled to the first local bit line, and the second end of each of the first memory units being coupled to the second local bit line; and a plurality of switches, the switches comprising a first switch, a second switch, a third switch and a fourth switch; wherein the first global bit line is coupled to the first local bit line through the first switch and coupled to the second local bit line through the second switch; the third switch is coupled between a first voltage source V1 and the first local bit line; and the fourth switch is coupled between a second voltage source V2 and the second local bit line.

The present invention flash memory structure comprises a lower number of global bit lines, and each global bit line can access one memory cell at the same time. Therefore the size of present invention flash memory can be smaller and the efficiency of the flash memory can be preserved. Furthermore, in a preferred embodiment of the present invention, the number of vias is reduced such that the flash memory structure can be manufactured more easily.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
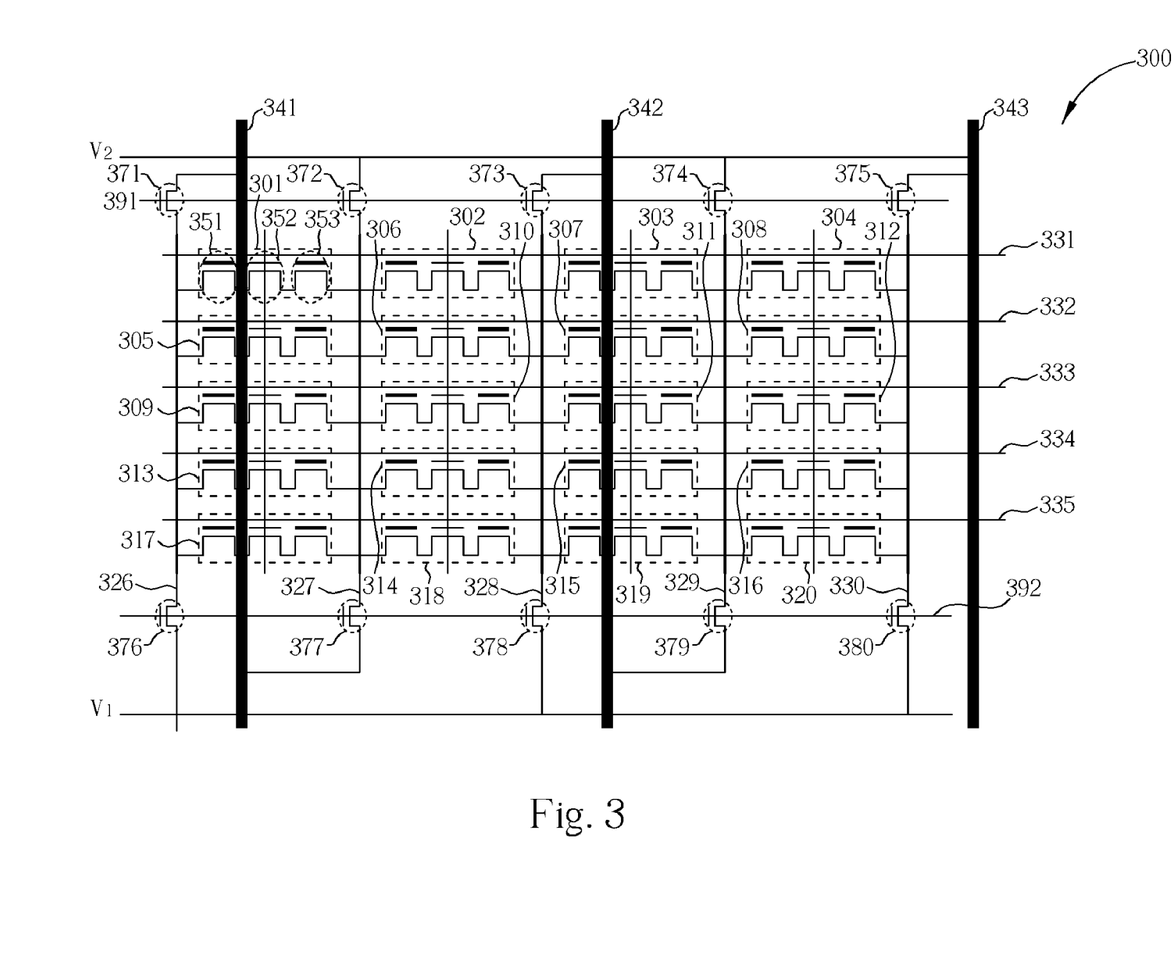
FIG. 3 is a diagram of a section of a flash memory device of a first embodiment according to the present invention.

Please refer to FIG. 3, the flash memory device 300 comprises a plurality of local bit lines 326-330, a plurality of word lines 331-335, a plurality of global bit lines 341-343, and a plurality of memory units 301-325 arranged in an array. Similarly, each memory unit 301-325 comprises a memory cell 351, a select switch 352, and a memory cell 353.

Furthermore, as shown in FIG. 3, the local bit line 326 is coupled to the global bit line 341 through a switch 371 and coupled to a first voltage source $V_1$ through a switch 376. The local bit line 327 is coupled to the global bit line 341 through a switch 377 and coupled to a second voltage source $V_2$ through a switch 372. The local bit line 328 is coupled to the global bit line 342 through a switch 373 and coupled to a first voltage source $V_1$ through a switch 378. The local bit line 329 is coupled to the global bit line 342 through a switch 379 and coupled to a second voltage source $V_2$ through a switch 374. Moreover, the local bit line 330 is coupled to the global bit line 343 through a switch 375 and coupled to a second voltage source $V_2$ through a switch 380.

In this embodiment, the switches 371-380 are implemented utilizing MOSFETs. Gates of the switches 371-375 are coupled to each other through a conducting line 391, and the gates of the switches 376-380 are coupled to each other through a conducting line 392. In other words, the switches 371-375 are controlled by the supplying voltage of the conducting line 391, and the switches 376-380 are controlled by the supplying voltage of the conducting line 392.

Figure 4:
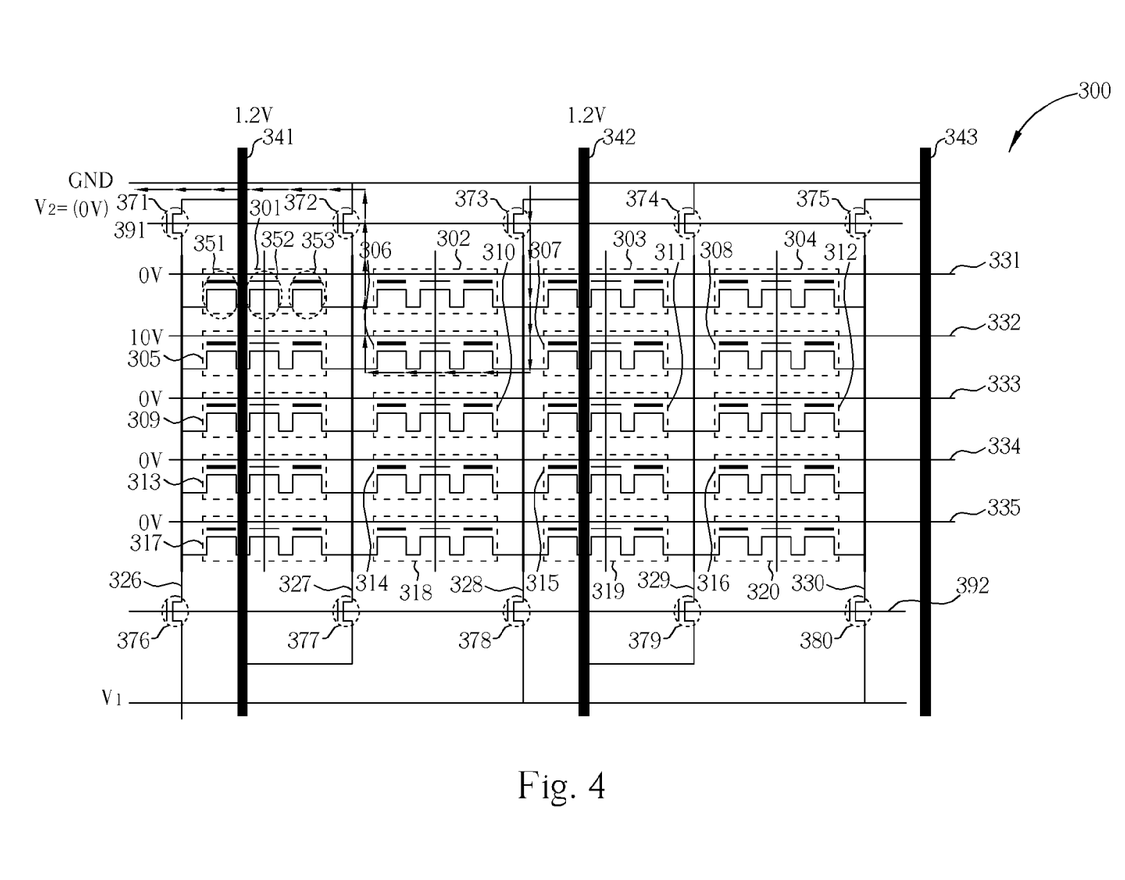
FIG. 4 is a diagram of the memory block shown in FIG. 3 performing the reading operation.

Please refer to FIG. 4, the memory cell 351 of the memory unit 306 is being read. The global bit line 342 is applied to 1.2V and voltage source V2 is applied to 0V. The conducting line 391 applies to a high voltage to turn on the switches 372 and 373. Local bit line 328 is coupled to 1.2V through the switch 373, and local bit line 327 is coupled to 0V through the switch 372 and the word line 332 is supplied by a high voltage such that the memory unit 306 can be selected. Therefore, the signal path shown in FIG. 4 can be established and the data stored inside memory cell 351 of the memory unit 306 can be read out successfully.

Figure 5:
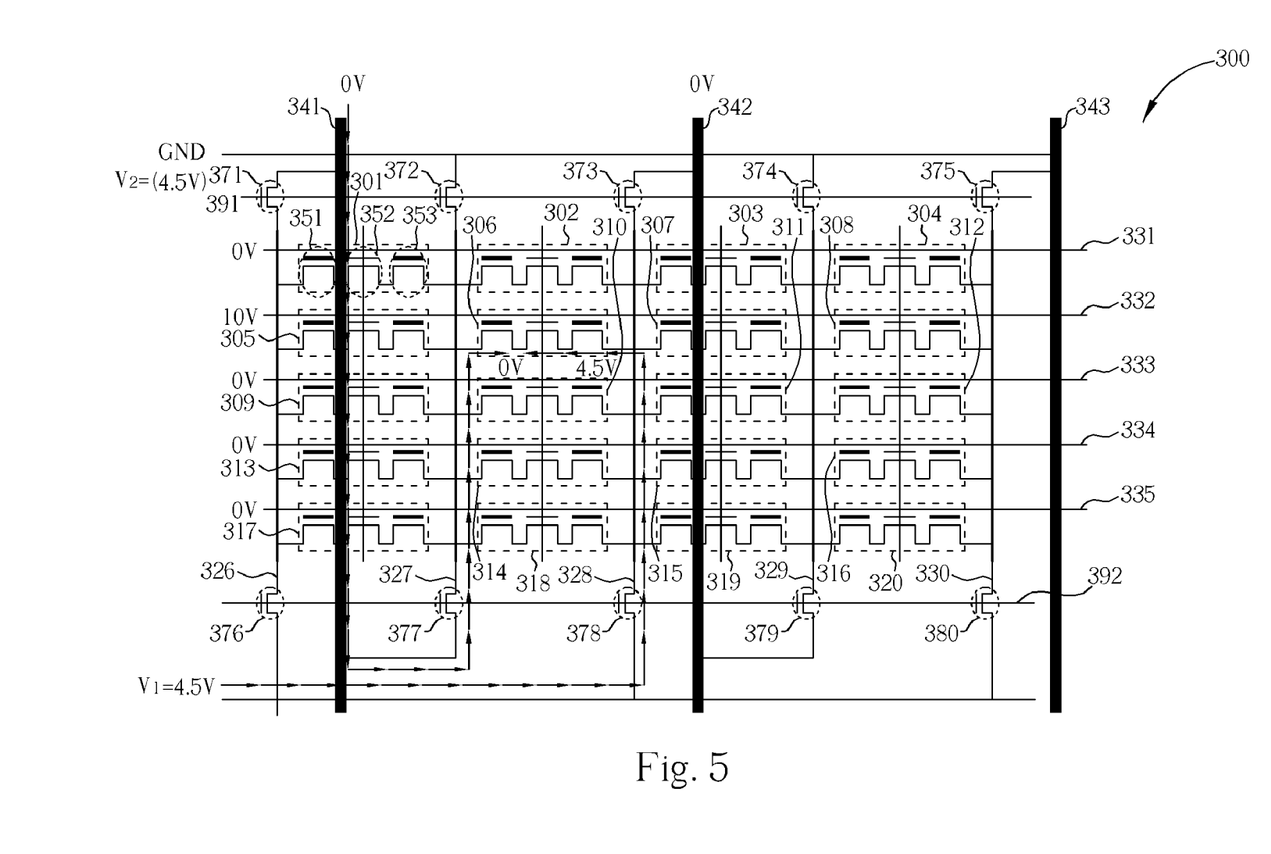
FIG. 5 is a diagram of the memory block shown in FIG. 3 performing the programming operation.

Please refer to FIG. 5; the memory cell 353 of the memory unit 306 is being programmed. In the programming operation, the local bit line 327 has to correspond to 0V and the local bit line 328 has to correspond to 4.5V. Therefore, The global bit line 341 is applied to 0V and voltage source $V_1$ is applied to 4.5V. The conducting line 392 applies to high voltage to turn on switch 377 and 378. Local bit line 327 is coupled to 0V through switch 377, and local bit line 328 is coupled to 4.5V through switch 378 and the word line 332 is supplied by a high voltage such that the memory unit 306 can be selected. Therefore, the signal path shown in FIG. 5 can be established. Data can be written into the selected memory unit successfully.

Figure 6:
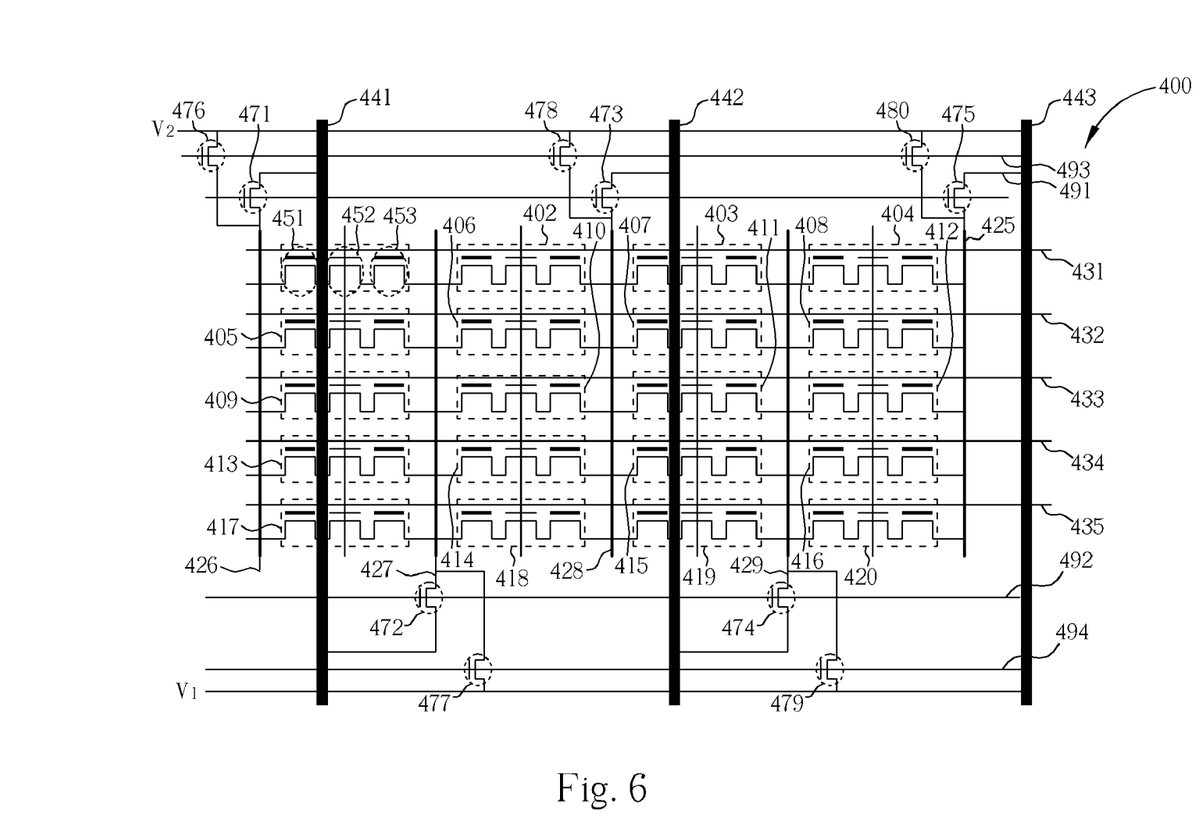
FIG. 6 is a diagram of a section of a flash memory device of a second embodiment according to the present invention.

Please refer to FIG. 6; the entire memory structure 400 is similar to the memory structure 300. The only difference between the memory structure 400 and the memory structure 300 is the positioning of switches 471-480. With the improvement of the semiconductor technology, the width of the memory unit becomes narrower. This means that the width may also exceed the size of the switches 371-380. In order to prevent the size of the switches 371-380 from limiting the entire size of the memory structure, in the second embodiment shown in FIG. 6 two switches are serially arranged such that two memory column corresponds to the width of only one switch, instead of two switches shown in FIG. 5.

Figure 7:
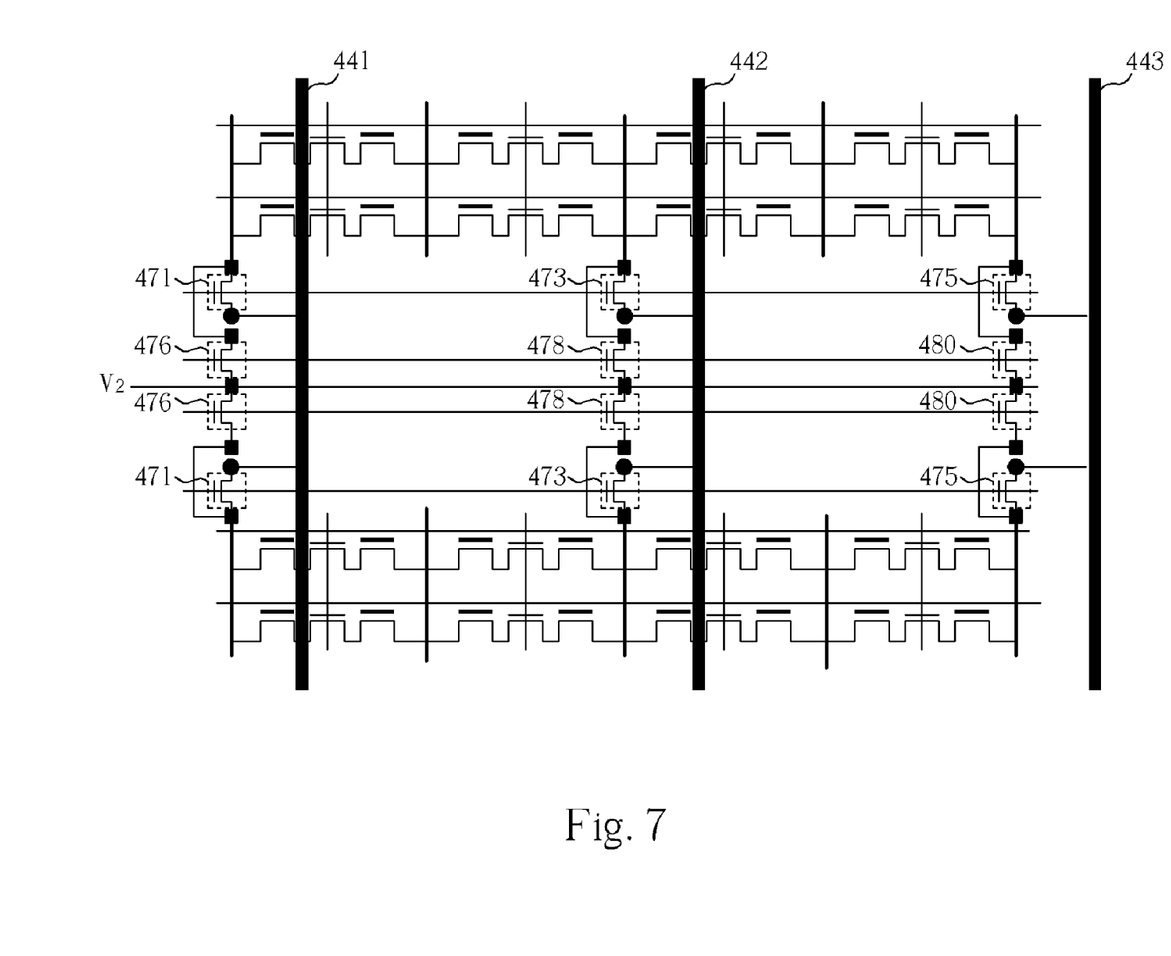
FIG. 7 is a diagram of a layout according to the memory structure shown in FIG. 6.

Please refer to FIG. 7, which is a diagram of a layout according to the memory structure 400 shown in FIG. 6. In FIG. 7, there are two partial memory blocks. Please note that in FIG. 7 a square represents a contact, and a circle represents a via. Because the layout corresponds to the memory structure 400 shown in FIG. 6, devices having the same numbers in FIG. 7 and FIG. 6 are the same devices. As shown in FIG. 7, the switches 476, 478, and 480 corresponding to different memory blocks share the same contact to be coupled to the second voltage source $V_2$.

Figure 8:
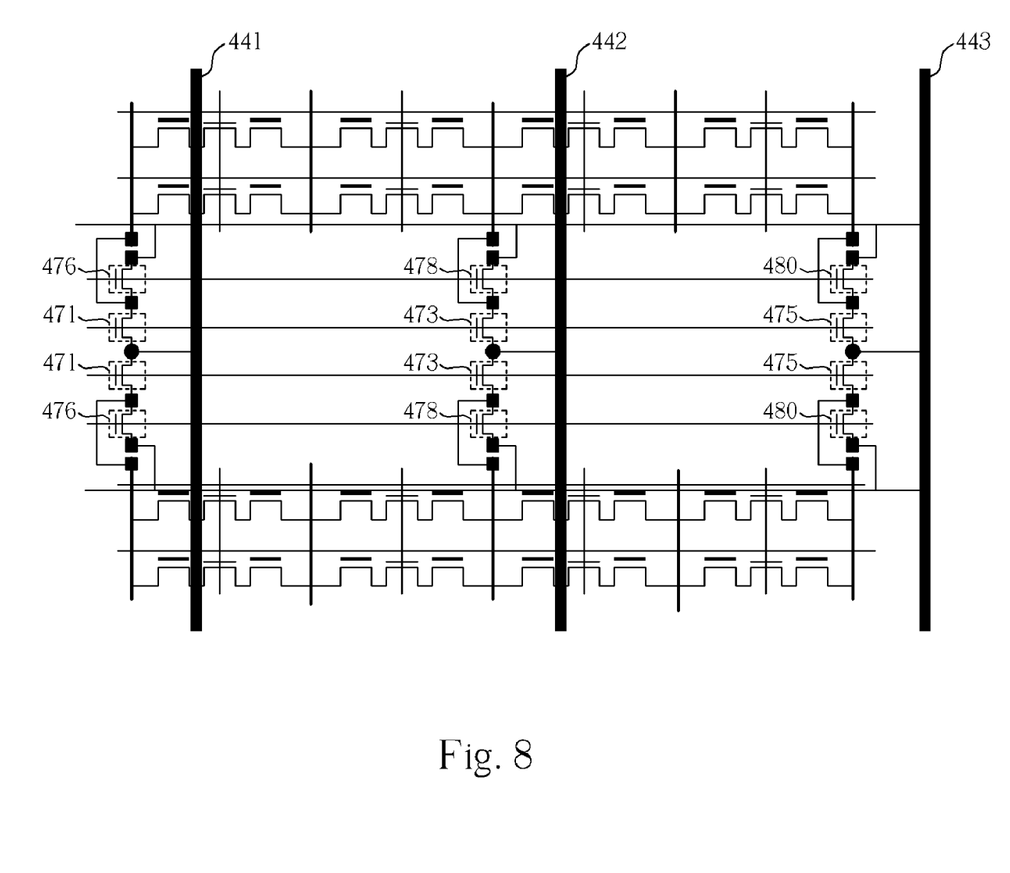
FIG. 8 is a diagram of another layout according to the memory structure shown in FIG. 6.

As is well known, the design rule of the via is more restrictive than that of the contact. Therefore, if the number of vias can be reduced, the entire memory structure can be formed more easily. With this in mind, another layout is disclosed here to reduce the number of vias. Please refer to FIG. 8, which is a diagram of another layout according to the memory structure 400 shown in FIG. 6. As shown in FIG. 8, the switches 471, 473, and 475 corresponding to different memory blocks share the same via to be coupled to the global bit line. Therefore, in contrast to the layout shown in FIG. 7, one via is replaced by a contact. For example, in a memory column shown in FIG. 8, there are 6 squares (contacts) and 1 circle (via). But in a memory column shown in FIG. 7, there are 5 squares (contacts) and 2 circles (via). In other words, the number of the vias is reduced. As mentioned previously, this allows the memory structure 400 to be manufactured more easily.

Similarly, the memory structure shown in FIG. 8 can also utilize switches 472 and 474 corresponding to different memory blocks to share the same via to be coupled to the global bit line. Obviously, this reduces more number of vias.

In contrast to the prior art, the present invention flash memory structure comprises a lower number of global bit lines and the reduced number of global bit lines does not influence the original operations of the entire flash memory. Furthermore, in a preferred embodiment of the present invention, the number of vias is reduced such that the flash memory structure can be manufactured more easily.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory comprising:
   a plurality of global bit lines comprising a first global bit line; and
   a plurality of memory blocks each comprising:
      a plurality of local bit lines, the local bit lines comprising a first local bit line and a second local bit line;
      a plurality of memory units arranged in an array, each of the memory units comprising a first memory cell coupled to a first end, a second memory cell coupled to a second end, and a select switch coupled to a select line, the first memory cell, and the second memory cell, wherein the memory units comprise a plurality of first memory units, the first end of each of the first memory units being coupled to the first local bit line, and the second end of each of the first plurality memory units being coupled to the second local bit line; and
      a plurality of switches, the switches comprising a first switch, a second switch, a third switch and a fourth switch;
      wherein the first global bit line is coupled to the first local bit line through the first switch and coupled to the second local bit line through the second switch; the third switch is coupled between a first voltage source and the first local bit line; and the fourth switch is coupled between a second voltage source and the second local bit line.

2. The flash memory of claim 1, wherein each of the first, second, third, and fourth switches is a MOSFET, gates of the first and fourth switches are coupled to each other through a first conducting line, and gates of the second and third switches are coupled to each other through a second conducting line.

3. The flash memory of claim 2, wherein both the first conducting line and the second conducting line are formed by poly-silicon.

4. The flash memory of claim 1, wherein the first voltage level is substantially equal to the second voltage level.

5. The flash memory of claim 4, wherein the memory blocks include a first memory block and a second memory block, and a first switch of the first memory block and a first switch of the second memory block are coupled to the first global bit line through a first via.

6. The flash memory of claim 4, wherein a second switch of the first memory block and a second switch of the second memory block are coupled to the first global bit line through a second via.

7. The flash memory of claim 1, wherein the first switch is placed adjacent to the third switch place in the same column, and the second switch is placed adjacent to the forth switch in the same column.

* * * * *